(12) United States Patent
Radfar et al.

(10) Patent No.: US 11,824,530 B2
(45) Date of Patent: Nov. 21, 2023

(54) LOW LATENCY, BROADBAND POWER-DOMAIN OFFSET-CORRECTION SIGNAL LEVEL CIRCUIT IMPLEMENTATION

(71) Applicant: AyDeeKay LLC, Aliso Viejo, CA (US)

(72) Inventors: Mohammad Radfar, Aliso Viejo, CA (US); Ichiro Aoki, Aliso Viejo, CA (US); Scott David Kee, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/712,026

(22) Filed: Apr. 1, 2022

(65) Prior Publication Data

US 2023/0042591 A1  Feb. 9, 2023

Related U.S. Application Data

(60) Provisional application No. 63/228,609, filed on Aug. 3, 2021.

(51) Int. Cl.
*H03K 19/00* (2006.01)
*H03K 19/0175* (2006.01)
*H03K 5/1252* (2006.01)
*H03K 19/0185* (2006.01)

(52) U.S. Cl.
CPC ... *H03K 19/017509* (2013.01); *H03K 5/1252* (2013.01); *H03K 19/0185* (2013.01); *H03K 19/018514* (2013.01)

(58) Field of Classification Search
CPC ......... H03K 19/017509; H03K 5/1252; H03K 19/0185; H03K 19/018514
See application file for complete search history.

(56) References Cited

U.S. PATENT DOCUMENTS

| | | | |
|---|---|---|---|
| 8,817,863 B2* | 8/2014 | Kaviani | H04L 25/03885 375/232 |
| 8,867,592 B2 | 10/2014 | Shrestha | |
| 8,963,622 B2 | 2/2015 | Lee et al. | |
| 9,083,574 B2* | 7/2015 | Scouten | H04L 25/0292 |
| 9,491,008 B2* | 11/2016 | Dong | H04L 25/03019 |
| 9,503,251 B2* | 11/2016 | Chong | H04B 3/54 |
| 9,998,301 B2 | 6/2018 | Yun et al. | |
| 10,684,669 B1 | 6/2020 | Zhou et al. | |

(Continued)

*Primary Examiner* — Tuan T Lam
(74) *Attorney, Agent, or Firm* — Steven Stupp (57) ABSTRACT

An interface circuit may convert an input electrical signal at an input node in a first power domain having a first ground or reference voltage into an output electrical signal at an output node in a second power domain having a second ground or reference voltage. Notably, a level-shifting circuit in the interface circuit may selectively electrically couple to the input node and the output node. Then, when there is electrical coupling, the level-shifting circuit may perform level shifting between the first power domain and the second power domain. The level shifting may involve: passing, using a first filter, frequencies in the input electrical signal below a first corner frequency; passing, using a second filter in parallel with the first filter, frequencies in the input electrical signal above a second corner frequency; and combining outputs of the first filter and the second filter as the output electrical signal.

20 Claims, 5 Drawing Sheets

(56) References Cited

U.S. PATENT DOCUMENTS

2010/0141340 A1\* 6/2010 Huang ................ H04L 25/0272
330/253
2014/0211862 A1 7/2014 Moghe et al.
2020/0373914 A1 11/2020 Cascio et al.

\* cited by examiner

LOW LATENCY, BROADBAND POWER-DOMAIN OFFSET-CORRECTION SIGNAL LEVEL CIRCUIT IMPLEMENTATION

CROSS REFERENCE TO RELATED APPLICATIONS

This application claims priority under 35 U.S.C. 119(e) to U.S. Provisional Application Ser. No. 63/228,609, entitled "Low Latency, Broadband Power-Domain Offset-Correction Signal Level Circuit Implementation," by Mohammad Radfar, filed on Aug. 3, 2021, the contents of both of which are herein incorporated by reference.

FIELD

The present disclosure relates to techniques for communicating electrical signals between power domains, including low-frequency and/or DC content.

BACKGROUND

In many existing signaling techniques, transmitter and receiver modules are located into two different power domains that can result in a large voltage offset between the ground and supply nodes between the transmitter and receiver modules. Moreover, because of the voltage offset, a receive electrical signal at the receiver module may be outside the input range of the receiver module or may violate an eye-diagram requirement. Consequently, the receive electrical signal may not be recovered.

For example, some existing signaling techniques use an AC-coupling capacitor between the power domains. While these approaches may address the ground offset between the power domains, it may also filter low-frequency content or component (including DC) of an electrical signal communicated between the power domains. Therefore, these approaches may not be suitable for use in applications or standards where the electrical signal contains information at lower frequencies. Similarly, existing signaling techniques that use a transformer between the power domains may also be unable to propagate low-frequency content and, thus, may not be suitable in many applications or standards.

Other existing signaling techniques address these challenges by upconverting the electrical signal in order to move the low-frequency and/or DC content to higher frequencies in order to pass the high-pass filtering associated with, e.g., an AC-coupling capacitor. Moreover, after crossing a boundary between the power domains, the upconverted electrical signal may be down-converted at the receiver module in order to recover the receive electrical signal. Note that these approaches may involve active circuits in the signal path, which may result in propagation delay. Therefore, these approaches may face additional challenges or complications in applications or standards with a low-latency requirement.

SUMMARY

Embodiments of an integrated circuit are described. This integrated circuit includes an interface circuit having an input node, in a first power domain, that receives an input electrical signal, where the first power domain has a first ground or reference voltage. Moreover, the interface circuit has an output node, in a second power domain, that outputs an output electrical signal, where the second power domain has a second ground or reference voltage. Furthermore, the interface circuit includes a level-shifting circuit, selectively electrically coupled to the input node and the output node, that performs level shifting between the first power domain and the second power domain. The level-shifting circuit includes: a first filter that passes frequencies in the input electrical signal below a first corner frequency; and a second filter, in parallel with the first filter, that passes frequencies in the input electrical signal above a second corner frequency. Additionally, the level-shifting circuit combines outputs of the first filter and the second filter as the output electrical signal.

Note that the first corner frequency may equals the second corner frequency. Alternatively or additionally, the first corner frequency may include a first 3 dB frequency and the second corner frequency may include a second 3 dB frequency.

Moreover, the first filter may include a switched-capacitor circuit, the second filter may include a passive filter, and the integrated circuit may include control logic that provides control signals that selectively open first switches and selectively close second switches in the switched-capacitor circuit. For example, the passive filter may include an AC-coupling capacitor between the first power domain and the second power domain. In some embodiments, the switched-capacitor circuit may correct DC content in the input electrical signal for a difference between the first ground or reference voltage and the second ground or reference voltage, and the output electrical signal may include the corrected DC content. Furthermore, the first filter may include a buffer circuit that drives a resistor.

Additionally, the input electrical signal and the output electrical signal may have a common waveform as a function of time.

In some embodiments, the level shifting between the first power domain and the second power domain may be performed with a latency less than a predefined value. For example, the latency may be a minimal latency.

Note that the input electrical signal and the output electrical signal may include analog electrical signals. Alternatively or additionally, the input electrical signal and the output electrical signal may include logic signals having multiple logic levels and temporal transition points between the logic levels. For example, the logic signals may be associated with asynchronous logic.

Moreover, the level-shifting circuit may have a multi-phase implementation.

Another embodiment provides an electronic device that includes the integrated circuit.

Another embodiment provides a system that includes the integrated circuit.

Another embodiment provides a method for communicating electrical signals that include a DC component from a first power domain to a second power domain. This method includes at least some of the operations performed by the interface circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit is described. This integrated circuit may include an interface circuit having an input node, in a first power domain, that receives an input electrical signal, where the first power domain has a first ground or reference voltage. Moreover, the interface circuit has an output node, in a second power domain, that outputs an output electrical signal, where the second power domain has a second ground or reference voltage. Furthermore, the interface circuit may include a level-shifting circuit, selectively electrically coupled to the input node and the output node, that performs level shifting between the first power domain and the second power domain. The level-shifting circuit may include: a first filter that passes frequencies in the input electrical signal below a first corner frequency; and a second filter, in parallel with the first filter, that passes frequencies in the input electrical signal above a second corner frequency. Additionally, the level-shifting circuit may combine outputs of the first filter and the second filter as the output electrical signal.

By communicating the electrical signals between the first power domain and the second power domain, these circuit techniques may allow low-frequency content (including the DC component) to be conveyed even in the presence of significant ground voltage differences. Moreover, the electrical signals may be communicated between the first power domain and the second power domain with reduced or minimal latency. These capabilities may allow the electrical signals to be communicated in applications or standards that include low-frequency content and/or that have low-latency requirements. For example, the circuit techniques may allow Universal Serial Bus (USB) 2.0 modules to be used in a variety of power delivery/charging configurations, while allowing the electrical signals to be recovered in the second power domain. Moreover, the circuit techniques may simplify and reduce the cost of the interface circuit and may improve the communication performance. Consequently, the circuit techniques may make the interface circuit more robust and reliable, and thus may facilitate the use of the interface circuit in a wide variety of systems, electronic devices and applications.

We now describe embodiments of the circuit techniques. The circuit techniques may be implemented using an interface circuit (which may be included in an integrated circuit). This interface circuit may include a first power domain and a second power domain. The first power domain and the second power domain may have different grounds or reference voltages. Moreover, the interface circuit may receive an input electrical signal as a function of time having a first ground or reference voltage, and may output an output electrical signal as a function of time having a different second ground or reference voltage with minimal latency. Furthermore, the output electrical signal of the interface circuit may have the same waveform (such as a same magnitude or amplitude and phase) as the input electrical signal. The input electrical signal and the output electrical signals may include analog signals and/or logic signals (e.g., two logic levels and temporal transition points between the logic levels). For example, the logic signals may be associated with asynchronous logic, which may require that the edge time propagation in the interface circuit is bounded (e.g., low latency). In some embodiments, the interface circuit includes a high-frequency path and a low-frequency path. The low-frequency path may correct DC content in the input electrical signal, and the high-frequency path may provide low latency for high-frequency content in the input signal. For example, the low-frequency path may drive a resistor, the high-frequency path may drive a capacitance, and the interface circuit may combine signals associated with the low-frequency path and the high-frequency path in order to provide level shifting. Note that the low-frequency path may include a switched-capacitance circuit.

The disclosed circuit techniques may provide an on-chip solution to level shift the electrical signals between two different supply and/or ground domains. Compared to existing signaling techniques (such as AC-coupling capacitors or a transformer), the circuit techniques may provide a more-robust, waveform-independent approach for signal transfer with significantly lower distortions and higher bandwidth for a given process node. Moreover, the circuit techniques may be waveform agnostic. This capability may be achieved in an integrated manner with a small die footprint without the need for electromagnetic components, such as transformers. Furthermore, the ground domains can be changing randomly with time, but at a lower bandwidth. Additionally, the circuit techniques may reduce the power consumption, because they do not require an active circuit in the signal path operating high speed where most of the power is normally consumed.

Figure 1:
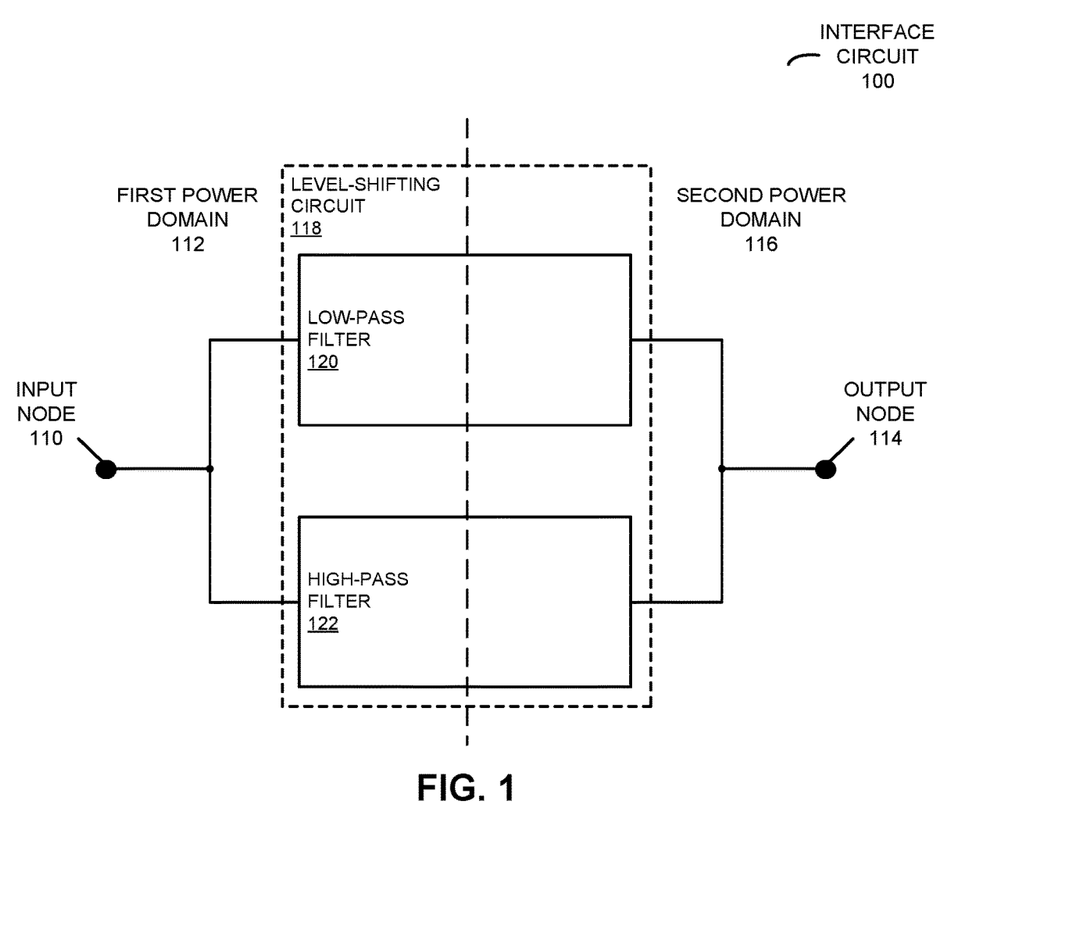
FIG. 1 is a block diagram illustrating an example of a level-shifting circuit in an interface circuit according to some embodiments of the present disclosure.

Notably, the circuit techniques may address the problems and challenges in existing signaling techniques using an architecture that provides a fully on-chip broadband low-latency (such as less than a few nanoseconds, e.g., 1 ns, and, more generally, less than a predefined value) solution that passes the electrical signal through two filter paths, including a low-pass filter path and a high-pass filter path. This is illustrated in FIG. 1, which provides a block diagram of an example of a level-shifting circuit 118 in an interface circuit 100, such as ground-offset level-shifting circuit. This interface circuit includes an input node 110 in a first power domain 112 having a first ground or reference voltage, and an output node 114 in a second power domain 116 having a second ground or reference voltage. Input node 110 may receive an input electrical signal and output node 114 may output an output electrical signal. Note that when a low-pass frequency of a low-pass filter 120 (such as an active switched-capacitor circuit) and a high-pass corner or pole frequency of a high-pass filter 122 (such as a passive filter) are the same, the high-frequency and the low-frequency content in the electrical signal passes through at least a path in FIG. 1 and level-shifting circuit 118 may have a flat gain as a function of frequency.

Figure 2:
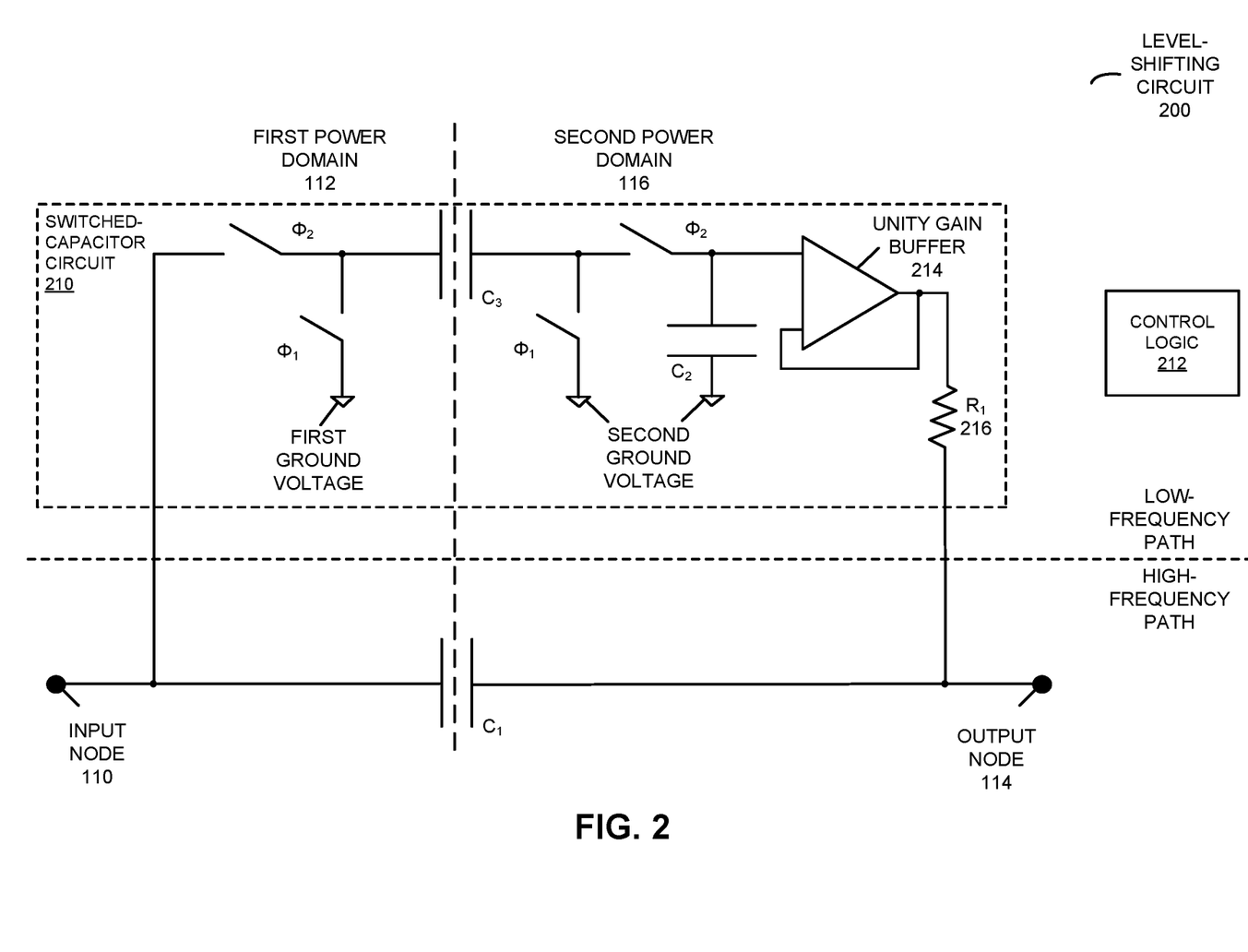
FIG. 2 is a block diagram illustrating an example of the level shifting circuit that uses a switched-capacitor circuit to sample low-frequency content and passes high-frequency content through a high-pass filter according to some embodiments of the present disclosure.

FIG. 2 provides a block diagram illustrating an example of the level shifting circuit 200 that uses a switched-capacitor circuit 210 to sample the low-frequency content and passes the high-frequency content through a high-pass filter. In this implementation, the bottom (high-frequency) path between input node 110 (e.g., a logic gate) and output node 114 (e.g., another logic gate) is a high-pass filter with 3 dB corner frequency of $1/(2\pi R_1 C_1)$. Note that the use of a passive circuit or component in this high-frequency path may result in reduced delay relative to an active circuit. Moreover, the high-frequency content is not limited by the maximum bandwidth of an active circuit, and the power consumption may be reduced relative to an active circuit.

Furthermore, in the top (low-frequency) path in FIG. 2, there may be different phases or operating modes. During a first phase or operating mode, a control signal φ1 from control logic 212 may close the switches in the first power domain 112 and the second power domain 116 so that they sample the difference of the two grounds or reference voltages on $C_3$ (e.g., 1-2 V), while control signal φ2 from control logic 212 may open the remaining switches. Then, during a transition between phases, the switches in the first power domain 112 and the second power domain 116 may be open, thereby blocking the paths to the grounds or the reference voltages. Moreover, in a second phase or operating mode, the control signal φ2 may close the switch in the first power domain 112 so that it shorts one side of $C_3$ to the input voltage on input node 110, which may result in the other side of $C_3$ shifting by the same amount. Furthermore, control signal φ2 may close the switch in the second power domain 116 so that the voltage shift on $C_3$ is applied to $C_2$. The resulting voltage on $C_2$ may be the input voltage plus the difference in the ground or reference voltages in the first power domain 112 and the second power domain 116. (Note that in FIG. 2, the ground or reference voltage in the first power domain 112 becomes part of the electrical signal in the second power domain 116.) Next, a unity gain buffer 214 may apply the voltage on $C_2$ through a low-frequency or low-pass filter (associated with $R_1$ 216) to output node 114. This low-pass filter may have a 3 dB corner frequency of a minimum of: $1/(2\pi R_1 C_1)$, a bandwidth (BW) of unity gain buffer 214, or a switching frequency. Thus, the low-pass filter may designed to have the same corner or pole frequency as the high-pass filter. Note that the input pole associated with the switches and the input to unity gain buffer 214 may be much higher than and, thus, may have a negligible impact relative to the dominant low-pass corner or pole frequency.

In some embodiments, the control signals may be megahertz signals (which may be AC-coupled to the switches in the switched-capacitor circuit 210), $R_1$ 216 equals 100 kΩ, $C_1$ equals 2 pF, $C_2$ equals 50 fF and $C_3$ equals 2 pF.

Figure 3:
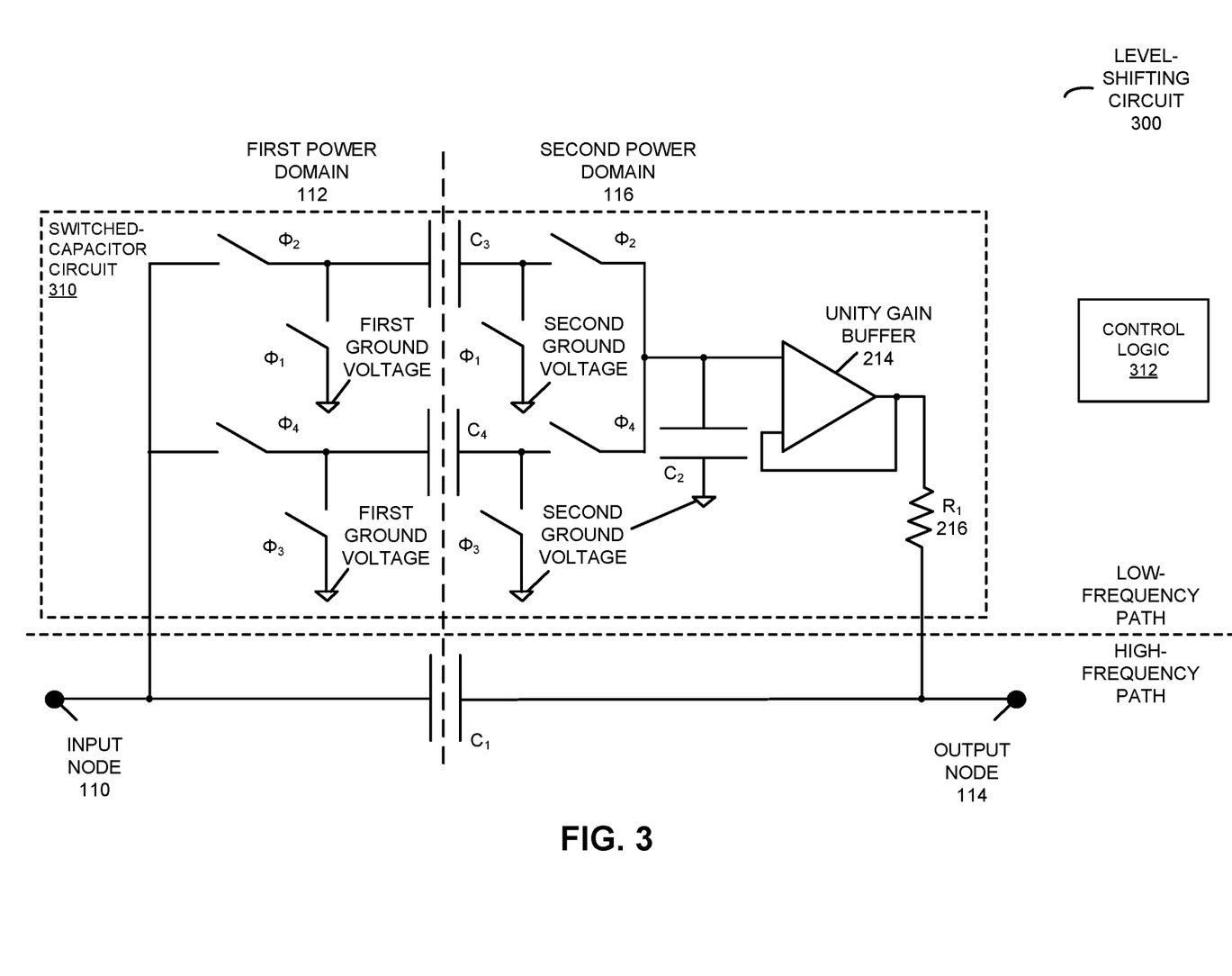
FIG. 3 is a block diagram illustrating an example of a multi-phase level shifting circuit that uses a switched-capacitor circuit to sample low-frequency content and passes high-frequency content through a high-pass filter according to some embodiments of the present disclosure.

FIG. 3 provides a block diagram illustrating an example of a multi-phase level shifting circuit 300 that uses a switched-capacitor circuit 310 to sample low-frequency content and passes high-frequency content through a high-pass filter. In general, the implementation of FIG. 3 may be generalized to N phases of drive displaced by 360/N degrees in each of the switched capacitor branches. (Note that in other contexts this approach is sometimes referred to as 'multi-phase'.)

In FIG. 3, in the first phase or operating mode, control signal φ1 from control logic 312 may close the switches in the first power domain 112 and the second power domain 116 so that they sample the difference of the two grounds or reference voltages on $C_3$; control signal φ3 from control logic 312 may open the switches in the first power domain 112 and the second power domain 116 so that they do not sample the difference of the two grounds or reference voltages on $C_4$; control signal φ2 from control logic 312 may open the switches in the first power domain 112 and the second power domain 116 so that they do not short one side of $C_3$ to the input voltage on input node 110 and they do not apply the voltage shift on $C_3$ to $C_2$; and control signal φ4 from control logic 312 may close the switches in the first power domain 112 and the second power domain 116 so that they short one side of $C_4$ to the input voltage on input node 110 and they apply the voltage shift on $C_4$ to $C_2$. Then, in the second phase or operating mode, control signal φ1 from control logic 312 may open the switches in the first power domain 112 and the second power domain 116 so that they do not sample the difference of the two grounds or reference voltages on $C_3$; control signal φ3 from control logic 312 may close the switches in the first power domain 112 and the second power domain 116 so that they sample the difference of the two grounds or reference voltages on $C_4$; control signal φ2 from control logic 312 may close the switches in the first power domain 112 and the second power domain 116 so that they short one side of $C_3$ to the input voltage on input node 110 and they apply the voltage shift on $C_3$ to $C_2$; and control signal φ4 from control logic 312 may open the switches in the first power domain 112 and the second power domain 116 so that they do not short one side of $C_4$ to the input voltage on input node 110 and they do not apply the voltage shift on $C_4$ to $C_2$. Consequently, in FIG. 3, a 50% duty cycle clock may be used, and switches in one path in switched-capacitor circuit 310 may be closed while corresponding instances of these switches the other path may be open (and vice versa). However, in other embodiments, a duty cycle other than 50% may be used (so long as one of $C_3$ and $C_4$ is always coupled, respectively to the grounds or reference voltages and input node 110 and $C_2$). For example, in the first phase or operating mode, φ1A may be short and φ2A may be long, while in the second phase or operating mode, φ1B may be short and φ2B may be long (and φ1A may or may not equal φ1B and φ2A may or may not equal φ2B). As noted previously, in some embodiments, the approach illustrated in FIG. 3 may be generalized to N phases of drive (where N is a non-zero integer) that are displaced by 360/N degrees in each of the N switched-capacitor branches. Note that the use of multiple paths in FIG. 3 may improve the accuracy and relax sampling requirements.

Figure 4:
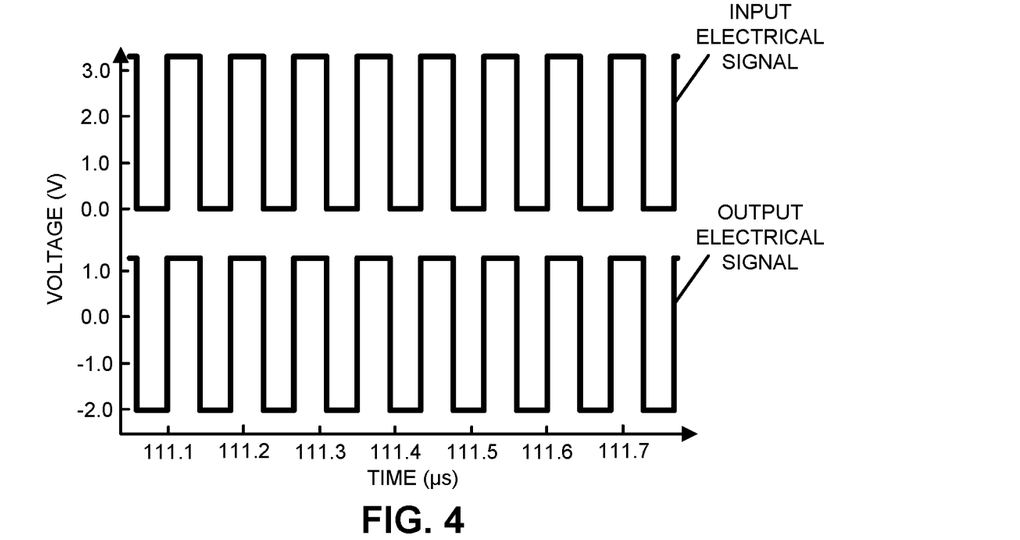
FIG. 4 is a drawing illustrating simulated input and output electrical signals for a negative ground offset according to some embodiments of the present disclosure.
Figure 5:
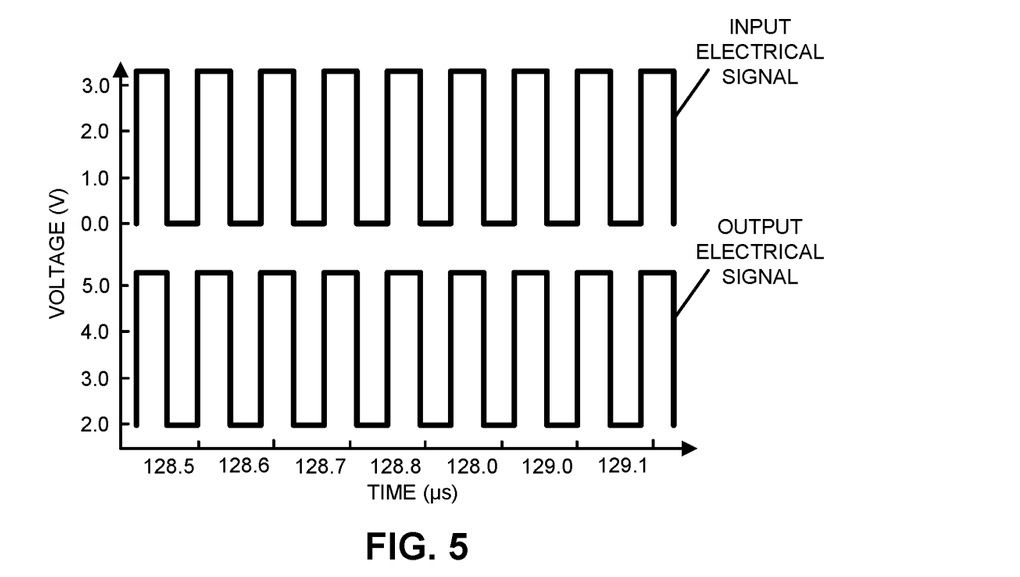
FIG. 5 is a drawing illustrating simulated input and output electrical signals for a positive ground offset according to some embodiments of the present disclosure.

FIGS. 4 and 5 provide drawings illustrating simulated input and output electrical signals for, respectively, a negative ground offset of −2 V and a positive ground offset of 2 V. While these electrical signals do not include DC content, in other embodiments the electrical signals may include DC content.

In some embodiments of the circuit techniques, the low-pass filter or path may not have a latency constraint (so long as the delay is much less than the $R_1 C_1$ time constant). Moreover, in some embodiments, the circuit techniques may be used in conjunction with upconverting and down-converting at the boundary between the first power domain 112 and the second power domain 116. Alternatively or additionally, in some embodiments, the input electrical signal may be converted to a digital signal before being conveyed across the boundary between the first power domain 112 and the second power domain 116. After passing over the boundary and/or level shifting, the digital signal may be converted back to an analog signal.

In some embodiments, the circuit techniques may be used in a communication module. For example, the communication module may be a USB 2.0 Transceiver Macrocell Interface (UTMI). More generally, the circuit techniques may be used in a wide variety of other applications.

Figure 6:
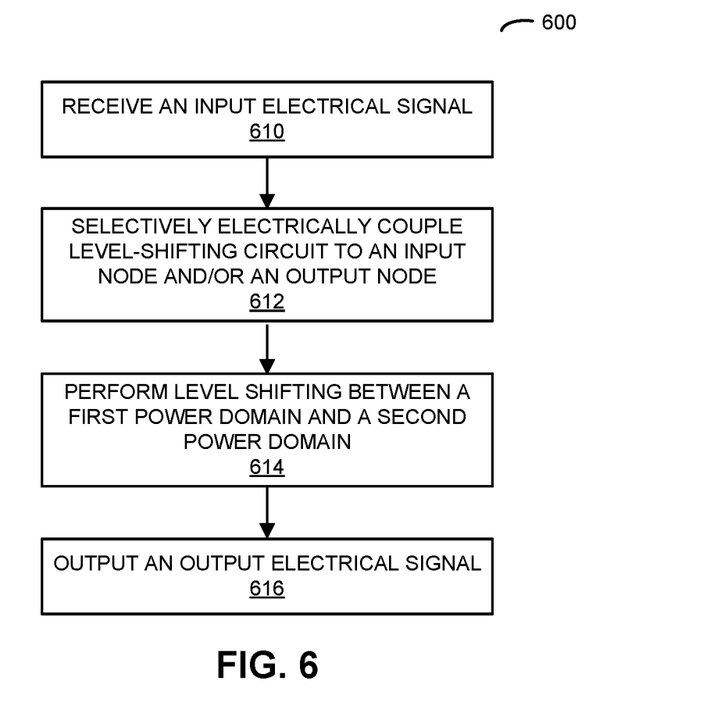
FIG. 6 is a flow diagram illustrating an example of a method for communicating electrical signals that include a DC component from a first power domain to a second power domain according to some embodiments of the present disclosure.

We now describe embodiments of a method. FIG. 6 presents a flow diagram illustrating an example of a method 600 for communicating electrical signals that include a DC component from a first power domain to a second power domain using an interface circuit, such as interface circuit 100 (FIG. 1). During operation, the interface circuit may receive, at an input node in the first power domain, an input electrical signal (operation 610), where the first power domain has a first ground or reference voltage. Then, the interface circuit may selectively electrically couple a level-shifting circuit to the input node and/or an output node (operation 612) in the second power domain having a second ground or reference voltage.

When the level-shifting circuit is electrically coupled to the input node and the output node (operation 612), the interface circuit may perform, using the level-shifting circuit, level shifting between the first power domain and the second power domain (operation 614). Note that the level shifting (operation 614) may involve: passing, using a first filter, frequencies in the input electrical signal below a first corner frequency; passing, using a second filter in parallel with the first filter, frequencies in the input electrical signal above a second corner frequency; and combining outputs of the first filter and the second filter as an output electrical signal.

Next, the interface circuit may output, at the output node, the output electrical signal (operation 616).

In some embodiments of the method 600, there may be additional or fewer operations. Moreover, the order of the operations may be changed, and/or two or more operations may be combined into a single operation.

The disclosed interface circuit and the circuit techniques can be (or can be included in) any electronic device or system. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the interface circuit and/or the integrated circuit that includes the interface circuit, in alternative embodiments different components and/or subsystems may be present in the interface circuit and/or the integrated circuit that includes the interface circuit. Thus, the embodiments of the interface circuit and/or the integrated circuit that includes the interface circuit may include fewer components, additional components, different components, two or more components may be combined into a single component, a single component may be separated into two or more components, one or more positions of one or more components may be changed, and/or there may be different types of components.

Moreover, the circuits and components in the embodiments of the interface circuit and/or the integrated circuit that includes the interface circuit may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising an interface circuit, wherein the interface circuit comprises:
   an input node, in a first power domain, configured to receive an input electrical signal, wherein the first power domain has a first ground or reference voltage;
   an output node, in a second power domain, configured to output an output electrical signal, wherein the second power domain has a second ground or reference voltage;
   a level-shifting circuit, selectively electrically coupled to the input node and the output node, configured to perform level shifting between the first power domain and the second power domain, wherein the level-shifting circuit comprises:
   a first filter configured to pass frequencies in the input electrical signal below a first corner frequency; and
   a second filter, in parallel with the first filter, configured to pass frequencies in the input electrical signal above a second corner frequency;
   wherein the level-shifting circuit is configured to combine outputs of the first filter and the second filter as the output electrical signal; and
   wherein the first filter comprises a switched-capacitor circuit and a buffer circuit configured to drive a resistor, and the second filter comprises a passive filter; and
   control logic configured to provide control signals that selectively open first switches and selectively close second switches in the switched-capacitor circuit.

2. The integrated circuit of claim 1, wherein the first corner frequency equals the second corner frequency.

3. The integrated circuit of claim 1, wherein the first corner frequency comprises a first 3 dB frequency and the second corner frequency comprises a second 3 dB frequency.

4. The integrated circuit of claim 1, wherein the passive filter comprises an AC-coupling capacitor between the first power domain and the second power domain.

5. The integrated circuit of claim 1, wherein the switched-capacitor circuit is configured to correct DC content in the input electrical signal for a difference between the first ground or reference voltage and the second ground or reference voltage, and the output electrical signal comprises the corrected DC content.

6. The integrated circuit of claim 1, wherein the input electrical signal and the output electrical signal have a common waveform as a function of time.

7. The integrated circuit of claim 1, wherein the level shifting between the first power domain and the second power domain is performed with a latency less than a predefined value.

8. The integrated circuit of claim 1, wherein the input electrical signal and the output electrical signal comprise analog electrical signals.

9. The integrated circuit of claim 1, wherein the input electrical signal and the output electrical signal comprise logic signals having multiple logic levels and temporal transition points between the logic levels.

10. The integrated circuit of claim 9, wherein the logic signals are associated with asynchronous logic.

11. The integrated circuit of claim 1, wherein the level-shifting circuit has a multi-phase implementation.

12. A system, comprising:
   an integrated circuit, wherein the integrated circuit comprises an interface circuit, and wherein the interface circuit comprises:
   an input node, in a first power domain, configured to receive an input electrical signal, wherein the first power domain has a first ground or reference voltage;
   an output node, in a second power domain, configured to output an output electrical signal, wherein the second power domain has a second ground or reference voltage; and
   a level-shifting circuit, selectively electrically coupled to the input node and the output node, configured to perform level shifting between the first power domain and the second power domain, wherein the level-shifting circuit comprises:
   a first filter configured to pass frequencies in the input electrical signal below a first corner frequency; and
   a second filter, in parallel with the first filter, configured to pass frequencies in the input electrical signal above a second corner frequency;
   wherein the level-shifting circuit is configured to combine outputs of the first filter and the second filter as the output electrical signal; and
   wherein the first filter comprises a switched-capacitor circuit and a buffer circuit configured to drive a resistor, and the second filter comprises a passive filter; and
   control logic configured to provide control signals that selectively open first switches and selectively close second switches in the switched-capacitor circuit.

13. The system of claim 12, wherein the first corner frequency equals the second corner frequency.

14. The system of claim 12, wherein the switched-capacitor circuit is configured to correct DC content in the input electrical signal for a difference between the first ground or reference voltage and the second ground or reference voltage, and the output electrical signal comprises the corrected DC content.

15. A method for communicating electrical signals that include a DC component from a first power domain to a second power domain, comprising:
   by an interface circuit:
   receiving, at an input node in the first power domain, an input electrical signal, wherein the first power domain has a first ground or reference voltage;
   selectively electrically coupling a level-shifting circuit to the input node and an output node in the second power domain having a second ground or reference voltage;
   when the level-shifting circuit is electrically coupled to the input node and the output node, performing, using the level-shifting circuit, level shifting between the first power domain and the second power domain, wherein the level shifting comprises:
   passing, using a first filter, frequencies in the input electrical signal below a first corner frequency, wherein the first filter comprises a switched-capacitor circuit and a buffer circuit that drives a resistor;
   passing, using a second filter in parallel with the first filter, frequencies in the input electrical signal above a second corner frequency, wherein the second filter comprises a passive filter;

combining outputs of the first filter and the second filter as an output electrical signal; and providing, using control logic, control signals that selectively open first switches and selectively close second switches in the switched-capacitor circuit and outputting, at the output node, the output electrical signal.

16. The method of claim 15, wherein the input electrical signal and the output electrical signal comprise: analog electrical signals; or logic signals having multiple logic levels and temporal transition points between the logic levels.

17. The method of claim 15, wherein the first corner frequency equals the second corner frequency.

18. The method of claim 15, wherein the level shifting between the first power domain and the second power domain is performed with a latency less than a predefined value.

19. The method of claim 15, wherein the passive filter comprises an AC-coupling capacitor between the first power domain and the second power domain.

20. The method of claim 15, wherein the input electrical signal and the output electrical signal have a common waveform as a function of time.

* * * * *